(12) United States Patent
Wang et al.

(10) Patent No.: US 8,514,043 B2
(45) Date of Patent: Aug. 20, 2013

(54) SYSTEMS AND METHODS FOR PASSIVELY SHIELDING A MAGNETIC FIELD

(75) Inventors: Jian-She Wang, Florence, SC (US);
Jinhua Huang, Florence, SC (US);
Stephen R. Elgin, Florence, SC (US)

(73) Assignee: General Electric Company, Schenectady, NY (US)

( * ) Notice: Subject to any disclaimer, the term of this patent is extended or adjusted under 35 U.S.C. 154(b) by 1624 days.

(21) Appl. No.: 11/225,957

(22) Filed: Sep. 14, 2005

(65) Prior Publication Data
US 2007/0057754 A1    Mar. 15, 2007

(51) Int. Cl.
*H01F 7/00*    (2006.01)
(52) U.S. Cl.
USPC ........................................... 335/301
(58) Field of Classification Search
USPC .................. 335/296–299, 302–306, 301
See application file for complete search history.

(56) References Cited

U.S. PATENT DOCUMENTS

| | | | |
|---|---|---|---|
| 4,646,046 A | 2/1987 | Vavrek et al. | |
| 4,651,099 A | 3/1987 | Vinegar et al. | |
| 4,743,880 A * | 5/1988 | Breneman et al. | 335/301 |
| 4,931,759 A | 6/1990 | Breneman et al. | |
| 5,001,448 A | 3/1991 | Srivastava et al. | |
| 5,128,643 A | 7/1992 | Newman | |
| 5,488,339 A | 1/1996 | Havens et al. | |
| 5,994,903 A | 11/1999 | Ladebeck | |
| 6,617,853 B2 * | 9/2003 | Bovier et al. | 324/320 |
| 7,141,974 B2 * | 11/2006 | Edelstein et al. | 324/318 |
| 2007/0272369 A1 * | 11/2007 | Saito et al. | 160/127 |
| 2008/0129068 A1 * | 6/2008 | Brummel et al. | 296/24.38 |

FOREIGN PATENT DOCUMENTS

GB    2237881 A    5/1991

* cited by examiner

*Primary Examiner* — Bernard Rojas
(74) *Attorney, Agent, or Firm* — The Small Patent Law Group; Dean D. Small

(57) ABSTRACT

A passive magnetic field shielding system for shielding a fringe magnetic field is described. The passive magnetic field shielding system includes a magnet configured to generate a uniform magnetic field, an imaging system with associated electronics coupled to the magnet, and a passive shield configured to reduce the strength of the fringing magnetic field to approximately five Gauss at a distance from the passive shield.

22 Claims, 15 Drawing Sheets

SYSTEMS AND METHODS FOR PASSIVELY SHIELDING A MAGNETIC FIELD

BACKGROUND OF THE INVENTION

This invention relates generally to magnetic shielding and more particularly, to systems and methods for passive magnetic shielding.

A magnetic field generator for Magnetic Resonance Imaging (MRI), hereinafter referred to as a magnet, having a strength of 1 Tesla (T) or higher generates a fringing magnetic fields beyond the physical dimensions of the magnet itself.

Such magnetic fields are potentially dangerous and may have adverse effects on people who are within a proximity of such a magnet. As a result, it is generally considered desirable to limit or curtail the fringing magnetic fields of such magnets in an MRI system of a relocatable unit, such as a mobile van or a relocatable building. It is generally considered desirable to curtail the fringing magnetic fields below approximately five Gauss beyond a certain distance, for example, 15 centimeters, from the outside side-wall of the mobile MRI unit carrying the magnet.

The mobile MRI unit used to carry the magnet in sensitive environments includes shields that shield the fringing magnetic fields generated by the magnet to satisfy the limit. However, if a higher strength magnet, having a value of, for example, 3 T, is used, the shields may not be effective for the fringing magnetic fields generated by the higher strength magnet to meet the limits using conventional methods while satisfying the weight limitations for the mobile MRI unit set by the department of transportation or any other governing body

BRIEF DESCRIPTION OF THE INVENTION

In one aspect, a passive magnetic field shielding system for shielding a fringe magnetic field is described. The passive magnetic field shielding system includes a magnet configured to generate a uniform magnetic field, an imaging system with associated electronics coupled to the magnet, and a passive shield configured to reduce the strength of the fringing magnetic field to approximately five Gauss at a distance from the passive shield.

In another aspect, a relocatable magnetic resonance imaging (MRI) unit is described. The relocatable MRI unit includes a magnet configured to generate a uniform magnetic field and a passive shield configured to reduce the strength of the fringing magnetic field to a threshold level outside a region included within the passive shield and within a pedestrian area.

DETAILED DESCRIPTION OF THE INVENTION

Figure 1:
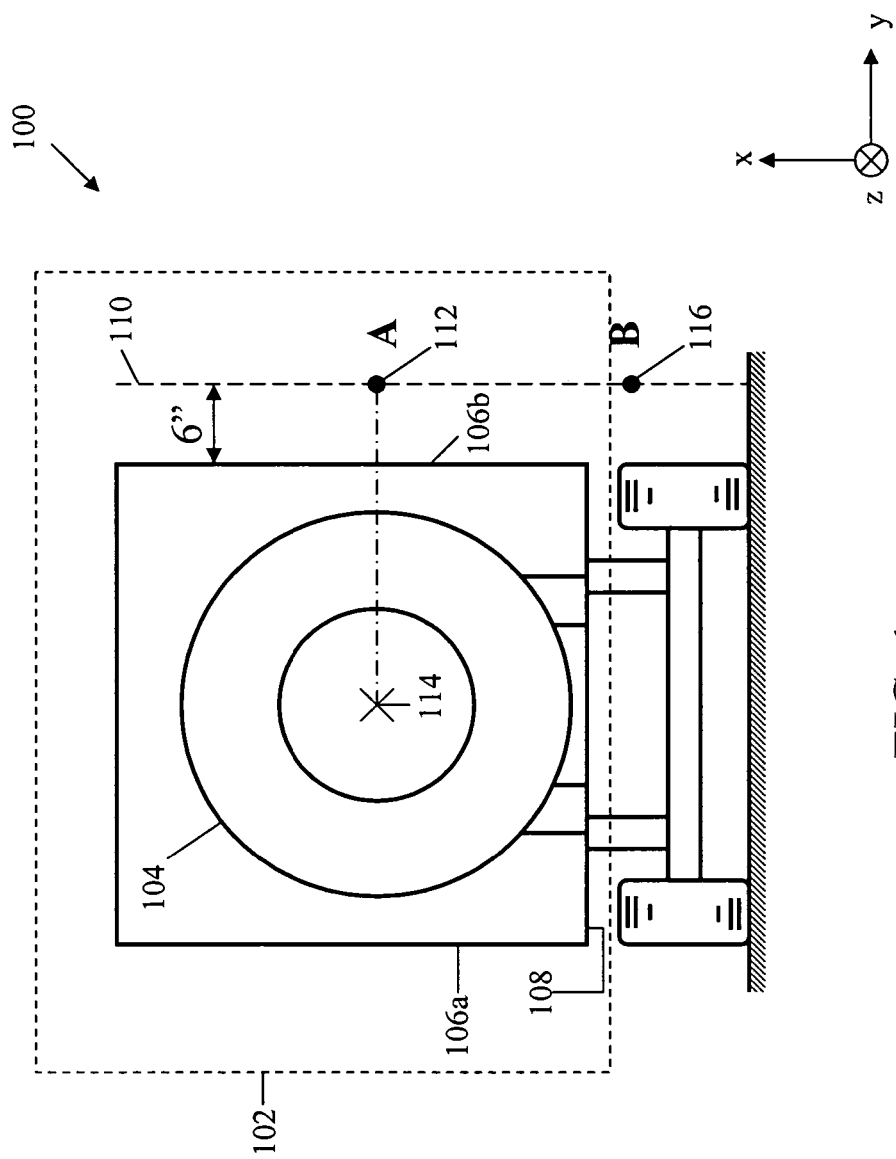
FIG. 1 shows a mobile MRI unit where a passive magnetic field shielding system may be used, in accordance with an exemplary embodiment of the invention.

FIG. 1 shows a mobile Magnetic Resonance Imaging (MRI) Unit 100, such as a mobile van, where a passive magnetic field shielding system 102 and a magnetic field generating device, such as a magnet 104, may be used, in accordance with an exemplary embodiment of the invention. Mobile MRI unit 100 includes an imaging system such as an MRI system. Further, the MRI system may include associated electronics, such as, a computer, an operator console, a display device, an analog-to-digital converter, a sequence memory circuit, gradient coil driving circuits, a gate modulation circuit, a radio frequency power amplifier, a radio frequency oscillating circuit, a phase detector, a preamplifier, gradient coils, a transmit coil, and a receive coil as described in U.S. Pat. No. 6,529,003 B2 and used for generating magnetic resonance images. Passive magnetic field shielding system 102 further includes a side-wall 106a, a side-wall 106b, and a base 108, hereinafter collectively referred to as a passive shield for passive magnetic field shielding system 102. Mobile MRI unit 100, (including automobile components such as a set of tires, an engine, a suspension system and the like) and, passive magnetic field shielding system 102, has a weight greater than 50,000 pounds, such as ranging from and including 50,000 pounds to and including 100,000 pounds. In various embodiments, mobile MRI unit 100 may include a mobile vehicle such as, for example, a van, a truck or a motor car, that includes passive magnetic shielding system 102. Magnet 104 generates a fringing magnetic field with a maximum strength ranging from and including 0.2 Tesla (T) to 3.5 T. An area between mobile MRI unit 100 and an imaginary Gauss line 110 is a pedestrian restricted area that is proximate to mobile MRI unit 100. A point 112 (point A) is located on an imaginary Gauss line 110 or within an area enclosed by the imaginary Gauss line 110 covering a perpendicular distance of approximately 6 inches, such as between 5.5 and 6.5 inches, from either side-wall 106a or side-wall 106b outside mobile MRI unit 100. The area covering the perpendicular distance of approximately 6 inches lies along mobile MRI unit 100. In one embodiment of the invention, point 112 is located at the same height as that of a center 114 of magnet 104. Further, a point 116 (point B) lies on imaginary Gauss line 110 or within an area enclosed by imaginary Gauss line 110, covering a radial distance of approximately two meters, such as between 1.5 meters and 2.5 meters, from center 114.

In various embodiments of the invention, passive magnetic field shielding system 102 is configured to reduce the fringing magnetic field of magnet 104 to approximately 5 Gauss, such as between 4.5 and 5.5 Gauss, within the area covering a perpendicular distance of approximately 6 inches from either side-wall 106a or side-wall 106b.

Figure 2:
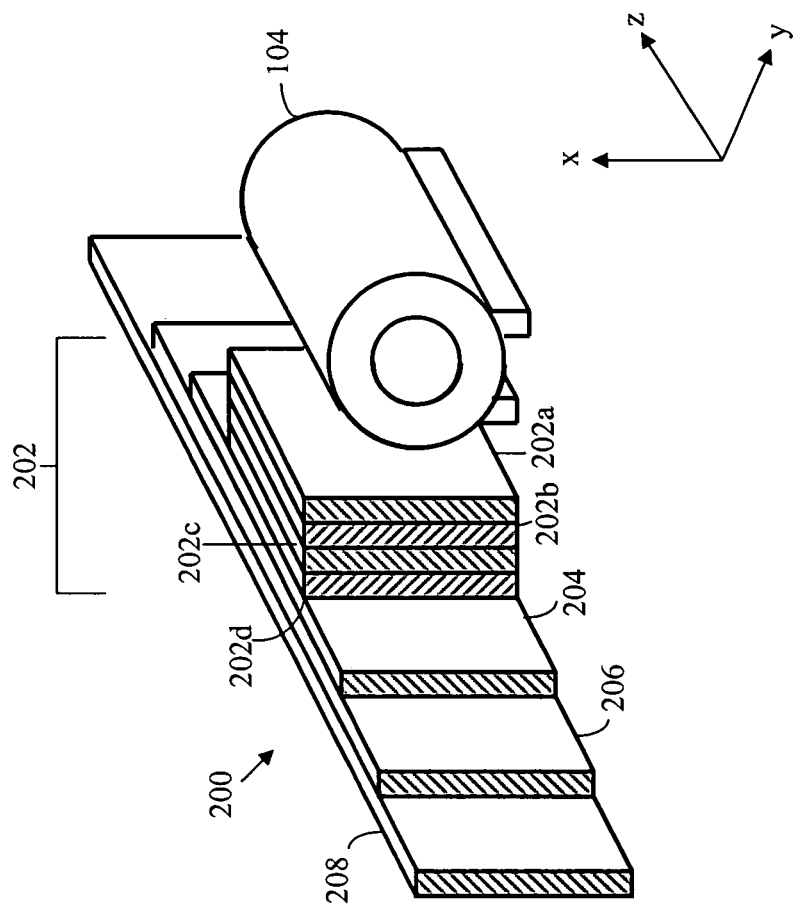
FIG. 2 shows a side-wall shield arrangement within the mobile MRI unit, in accordance with an exemplary embodiment of the invention.

FIG. 2 shows a side-wall arrangement 200 of each side-wall 106a and 106b, in accordance with an exemplary embodiment of the invention. Side-wall arrangement 200 includes a first plate 202a, a second plate 202b, a third plate 202c, a fourth plate 202d, a fifth plate 204, a sixth plate 206 and a seventh plate 208, which are parallel to one another. First plate 202a, second plate 202b, third plate 202c, and fourth plate 202d are hereinafter referred to as a first set of plates 202.

In an exemplary embodiment of the invention, first plate 202a, second plate 202b, third plate 202c, and fourth plate 202d are of equal height, width, and length, and are placed parallel to each other. In accordance with an alternative embodiment, fourth plate 202d is shorter than first plate 202a, second plate 202b, and third plate 202c. Further, fifth plate 204 is longer than first set of plates 202, and sixth plate 206 is longer than fifth plate 204 and is attached to seventh plate 208. Seventh plate 208 is longer than sixth plate 206. Fifth plate 204, sixth plate 206 and seventh plate 208 have the same height and width. Further, fourth plate 202d, fifth plate 204, sixth plate 206, and seventh plate 208 are arranged in order of increasing length because the fringing magnetic field is the greatest near center 114 of magnet 104 and gradually decreases along the length (z-axis) of magnet 104. It is noted that the heights of first set of plates 202, fifth plate 204, sixth plate 206, and seventh plate 208 are measured along an x-axis, the widths of first set of plates 202, fifth plate 204, sixth plate 206, and seventh plate 208 are measured along a y-axis, and the lengths of first set of plates 202, fifth plate 204, sixth plate 206, and seventh plate 208 are measured along a z-axis.

First set of plates 202, fifth plate 204, sixth plate 206 and seventh plate 208, are bolted together. Optionally, various other methods of attachment known in the art may be used for attaching first set of plates 202, fifth plate 204, sixth plate 206 and seventh plate 208. Examples of these methods include, mechanical interlocking, gluing (using adhesive substrates), chemical bonding, welding (friction and diffusion methods), brazing procedures, and soldering processes. In various embodiments, at least one plate in set of plates 202 is a ferrous plate.

Figure 3:
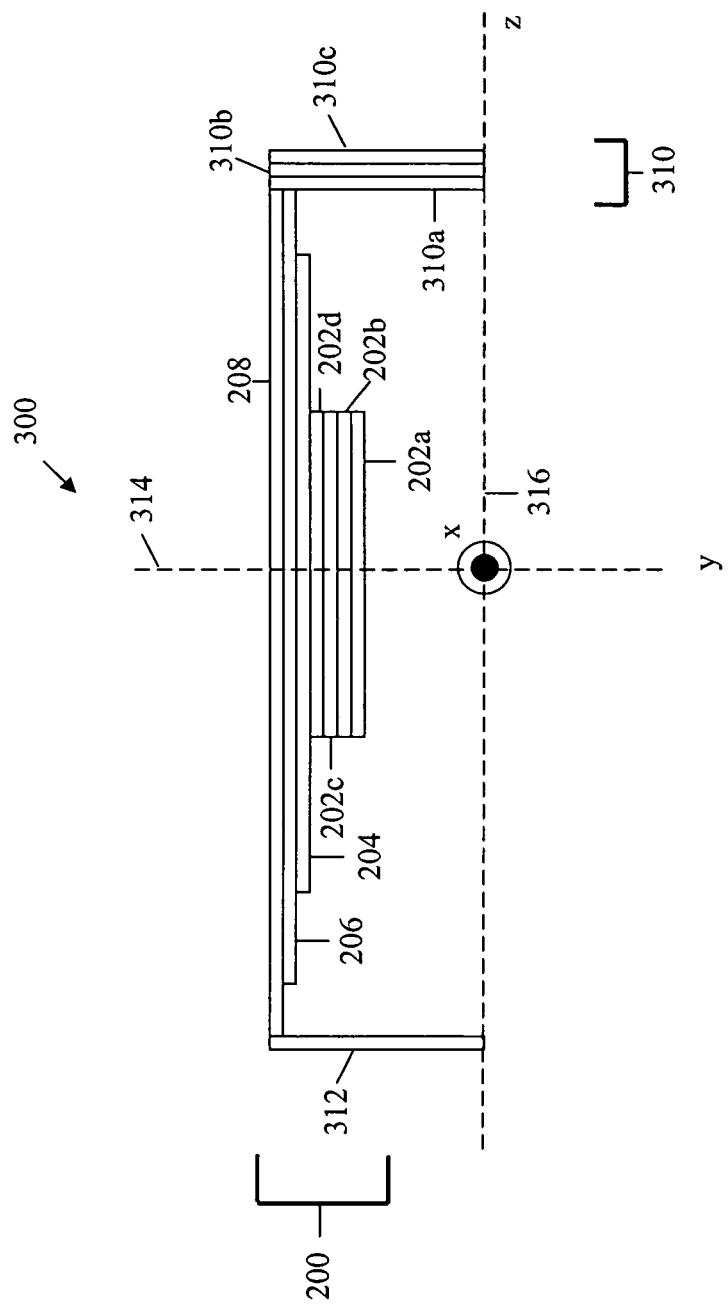
FIG. 3 shows a top view of a shield arrangement of the mobile MRI unit, in accordance with an exemplary embodiment of the invention.

FIG. 3 shows a top view of a shield arrangement 300, in accordance with an exemplary embodiment of the invention. Shield arrangement 300 includes side-wall arrangement 200. Further, a set of back plates 310 including a first back plate 310a, a second back plate 310b, and a third back plate 310c, are attached, such as, bolted, to a back end of side-wall arrangement 200. First back plate 310a, second back plate 310b, and third back plate 310c are attached, such as, bolted to each other. A front plate 312 is attached, such as, for example, bolted to a front end of side-wall arrangement 200.

Set of back plates 310 and front plate 312 are of same height as that of side-wall arrangement 200. Each plate in set of back plates 310 and front plate 312 are of the same length. Further, an intersection of an axis 314 (y-axis) and an axis 316 (z-axis) form center 114 of magnet 104.

It is noted that the length of first plate 202a, second plate 202b, third plate 202c, fourth plate 202d, fifth plate 204, sixth plate 206 is measured along axis 316. In an embodiment of the invention, each of first plate 202a, second plate 202b, third plate 202c, fourth plate 202d, fifth plate 204 and sixth plate 206 extends equally in a perpendicular direction from the axis 314.

Figure 4:
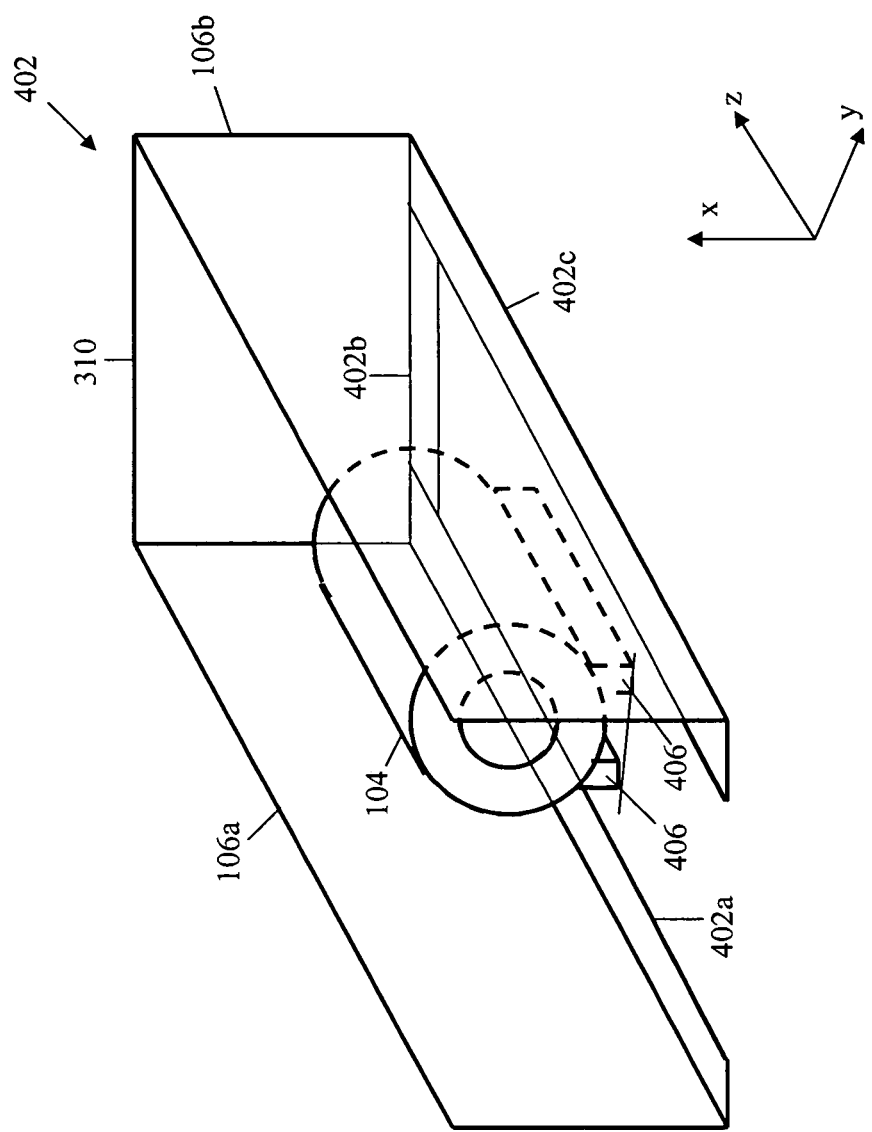
FIG. 4 shows an isometric view of an exemplary embodiment of the passive magnetic field shielding system of the mobile MRI unit.

FIG. 4 shows an isometric view of a shield layout 402, which is an exemplary embodiment of passive magnetic field shielding system 102. Shield layout 402 includes side-wall 106a, side-wall 106b, a foot shield or base section 402a, a foot shield or base section 402b, a foot shield or base section 402c and set of back plates 310, hereinafter collectively referred to as passive shield for shield layout 402.

In an embodiment of the invention, magnet 104 may be placed on a base 406 of mobile MRI unit 100 that is located at a perpendicular height above base sections 402a, 402b and 402c. In various embodiments of the invention, the perpendicular height is maintained to enable shielding of an area that includes point 112 (point A in FIG. 1) and point 116 (point B in FIG. 1) from center 114 of magnet 104. The perpendicular height may be approximately 3 inches, such as between 2.5 and 3.5 inches.

Base section 402a is attached, such as, bolted or welded, to side-wall 106a. Similarly, base section 402b is attached to set of back plates 310 and base section 402c is attached to side-wall 106b.

Figure 5:
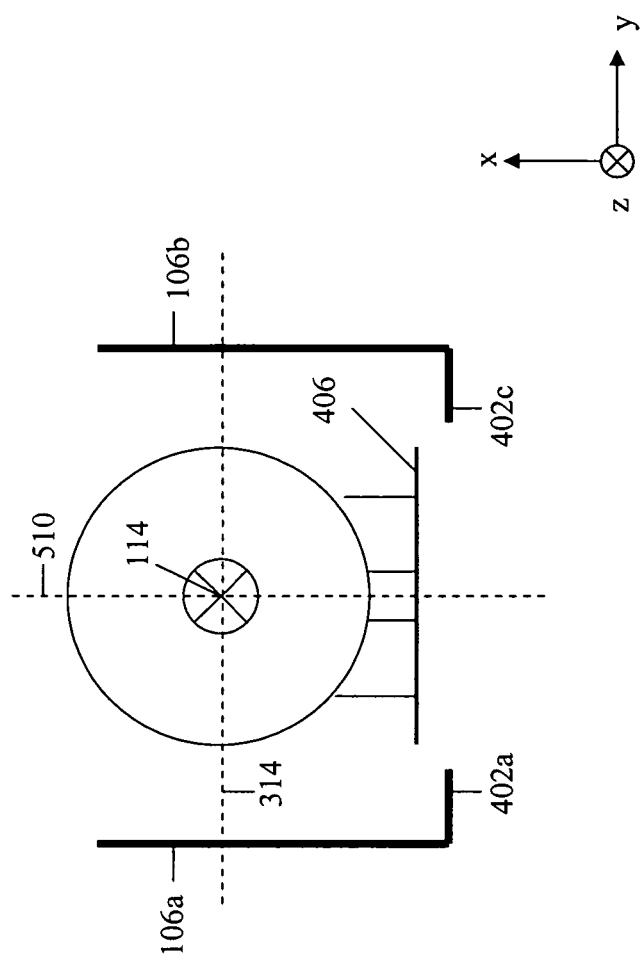
FIG. 5 shows a front view of the passive magnetic field shielding system of FIG. 4, in accordance with an exemplary embodiment of the invention.

FIG. 5 shows a front view of shield layout 402 in accordance with FIG. 4. An axis 510 (x-axis) and axis 314 (y-axis) pass through center 114 of magnet 104. In various embodiments, the width of base sections 402a and 402c (measured along axis 314) are identical. In various embodiments, the heights of side-wall 106a and side-wall 106b (measured along axis 510) are identical.

Figure 6:
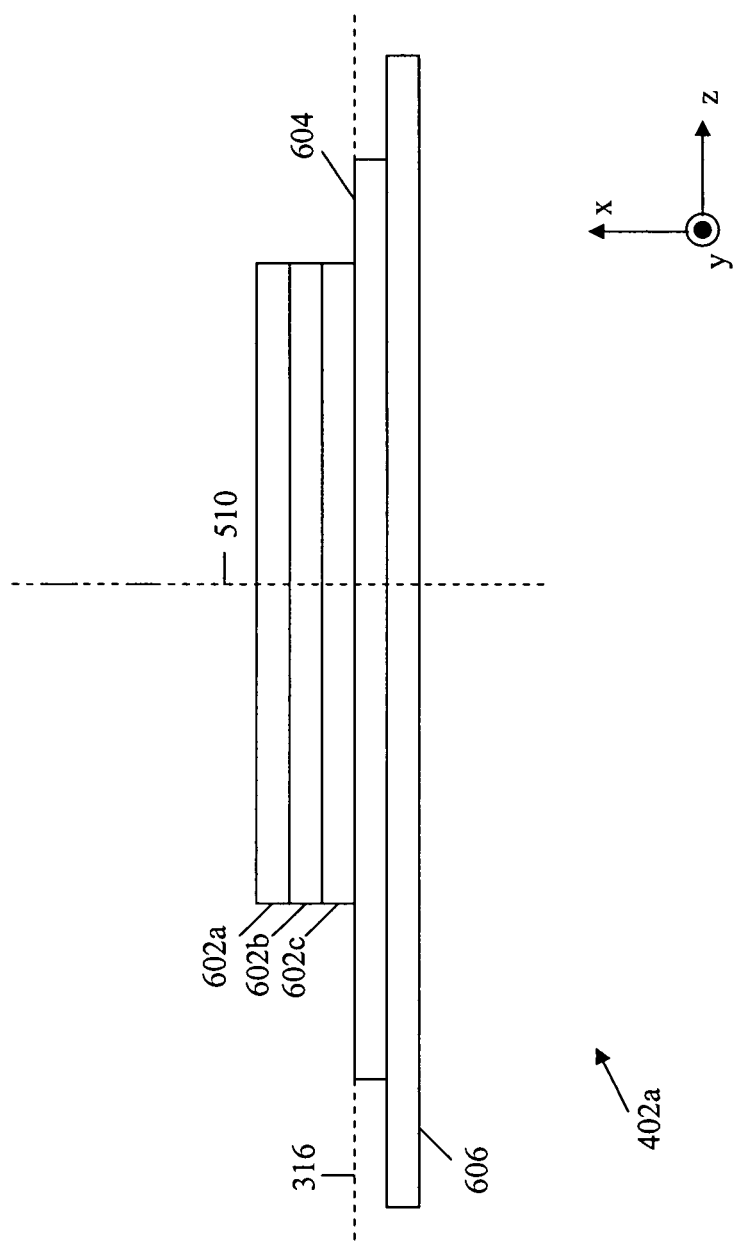
FIG. 6 is a side view of a base section that is placed in the mobile MRI unit, in accordance with an exemplary embodiment of the invention.

FIG. 6 shows a side view of base section 402a in accordance with various embodiments of the invention. Base section 402a includes five plates, namely a plate 602a, a plate 602b, a plate 602c, a plate 604 and a plate 606. In an embodiment of the invention, the width of plates 602a, 602b, 602c, 604 and 606 (measured along axis 510) are identical. In another embodiment of the invention, the length of each of plate 602a, 602b and 602c (measured along axis 316) is identical and is less than the length of plates 604 and 606. Further, the length of plate 606 is greatest among the five plates in base section 402a. It is noted that plates 602a, 602b, 602c and 604 extend equally in both directions from axis 510. The graded arrangement of plates in base section 402a enables shielding of an area along the length of magnet 104 in z-direction. In an embodiment of the invention, the dimensions of base section 402a are identical to that of base section 402c.

Figure 7:
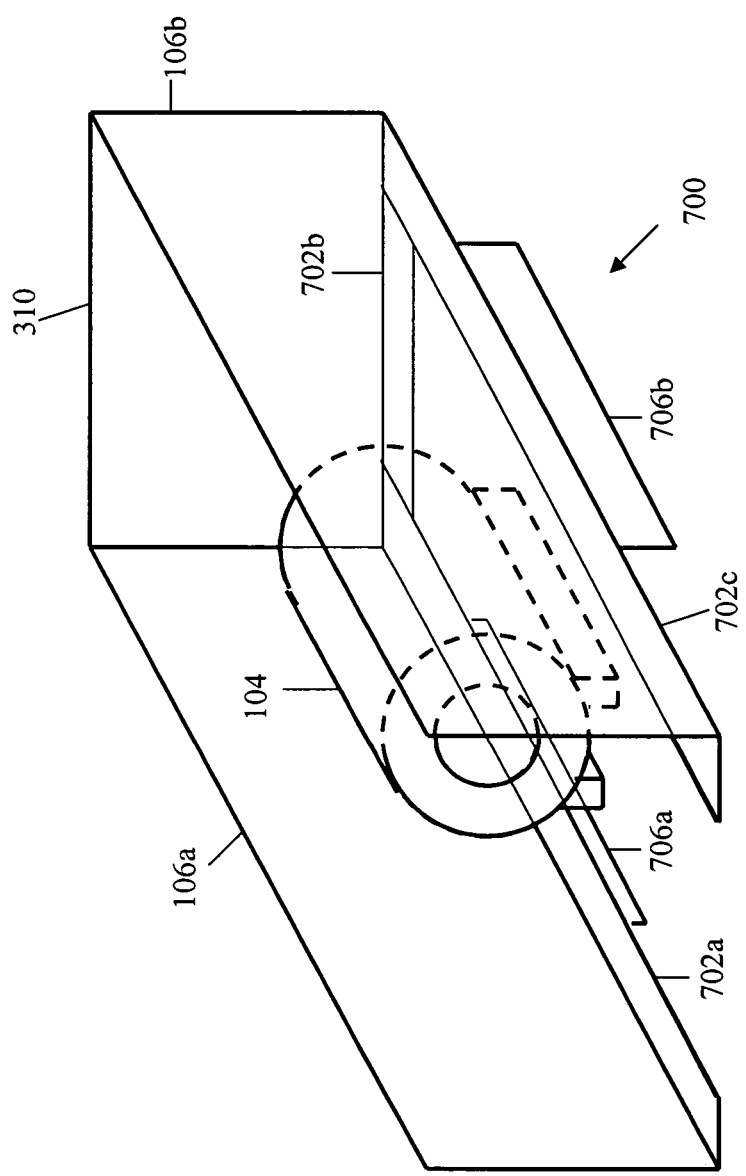
FIG. 7 shows an isometric view of a passive magnetic field shielding system, in accordance with another exemplary embodiment of the invention.

FIG. 7 shows an isometric view of a shield layout 700, which is an exemplary embodiment of passive magnetic field shielding system 102. Shield layout 700 includes side-wall 106a, side-wall 106b, a base section 702a, a base section 702b, a base section 702c and set of back plates 310, hereinafter collectively referred to as passive shield for shield layout 700. An extension or dropped side-wall 706a and an extension or dropped side-wall 706b are attached, such as bolted or welded, to base sections 702a and 702c respectively, to shield an area covering a radial distance that includes point 112 (point A in FIG. 1) and point 116 (point B in FIG. 1).

Figure 8:
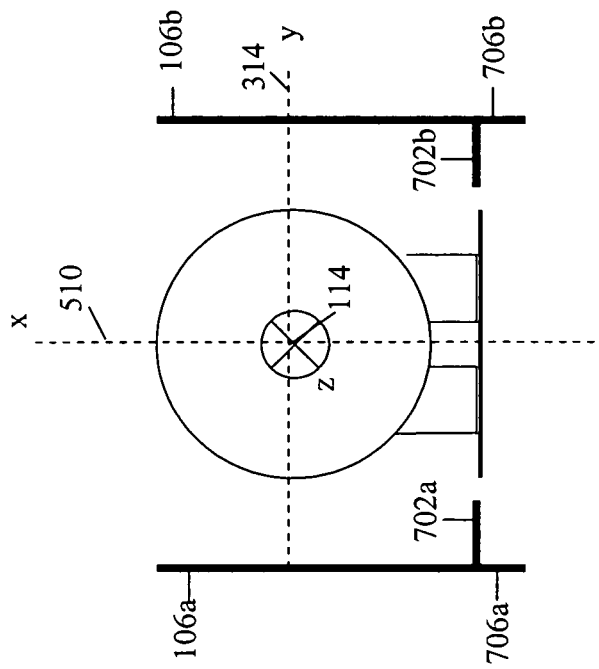
FIG. 8 shows a front view of the passive magnetic field shielding system of FIG. 7, in accordance with an exemplary embodiment of the invention.

FIG. 8 shows a front view of shield layout 700 in accordance with various embodiments of the invention. In various embodiments, the length of dropped side-walls 706a and 706b are equal to the length of first plate 202a in side-wall arrangement 200. Further, the heights (along axis 510) of dropped side-walls 706a and 706b are equal. Further, dropped side-wall 706a and dropped side-wall 706b may lie outside a controlled environment enclosed within mobile MRI unit 100.

Figure 9:
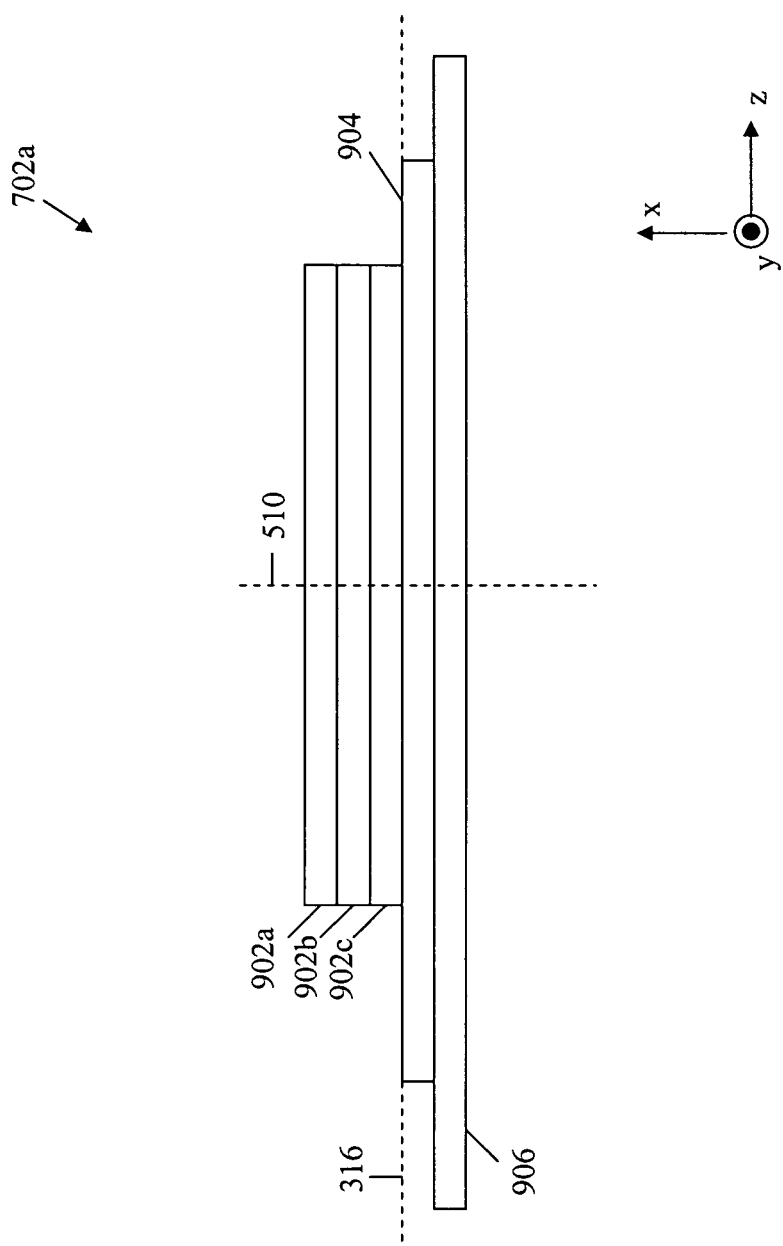
FIG. 9 is a side view of a base section that is placed within the mobile MRI unit, in accordance with an exemplary embodiment of the invention.

FIG. 9 is a side view of base section 702a in accordance with various embodiments of the invention. Base section 702a includes five plates, namely a plate 902a, a plate 902b, a plate 902c, a plate 904 and a plate 906. The width of each plate (measured along axis 510) 902a, 902b, 902c, 904 and 906 in base section 702a is identical. The length of plate 902a, 902b and 902c (measured along axis 316) is identical and is less than that of plates 904 and 906. Further, the length of plate 906 is greatest among the five plates in base section 702a. It is noted that plates 902a, 902b, 902c and 904 extend equally in both directions from axis 510. The graded arrangement of plates in base section 402a enables shielding of an area along the length of magnet 104 in z-direction. In an embodiment of the invention, the dimensions of base section 902a are identical to that of base section 902c.

Figure 10:
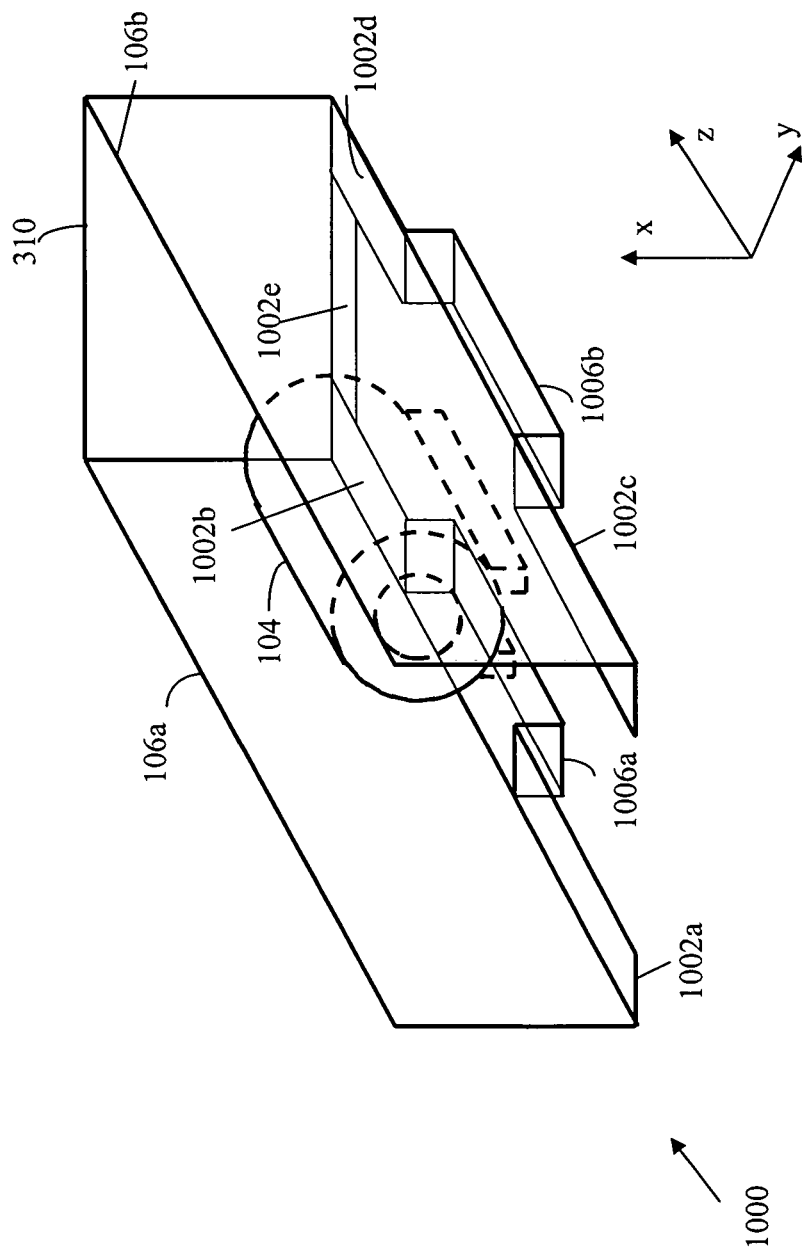
FIG. 10 shows an isometric view of yet another exemplary embodiment of the passive magnetic field shielding system in the mobile MRI unit.

FIG. 10 shows an isometric view of a shield layout 1000, which is an exemplary embodiment of passive magnetic field shielding system 102. Shield layout 1000 includes side-wall 106a, side-wall 106b, a base section 1002a, a base section 1002b, a base section 1002c, a base section 1002d, a base section 1002e, and set of back plates 310, hereinafter referred to as passive shield for shield layout 1000. Shield layout 1000 further includes an extension or foot shield section 1006a and an extension or a foot shield section 1006b. In an embodiment of the invention, magnet 104 may be placed (on a base of mobile MRI unit 100) at the same height as that of base sections 1002a, 1002b, 1002c, 1002d and 1002e.

Base section 1002a is located in front of foot shield section 1006a, and base section 1002b is located behind foot shield section 1006a. Similarly, base section 1002c is located in front of foot shield section 1006b, and base section 1002d is located behind foot shield section 1006b. Base section 1002e is attached, such as, bolted, to set of back plates 310 and lies between base 1002b and base 1002d. Foot shield section 1006a is attached, such as, bolted or welded, to side-wall 106a and foot shield section 1006b is attached, such as, bolted or welded, to side-wall 106b. Similarly, base sections 1002a and 1002b are attached to side-wall 106a, while base sections 1002c and 1002d are attached to side-wall 106b. Further, foot shield section 1006a and foot shield section 1006b lie in contact with the controlled environment of mobile MRI unit 100. Accordingly, temperature of foot shield section 1006a and foot shield 1006b can be controlled, for instance, by controlling a parameter, such as the temperature, of the controlled environment.

In various embodiments of the invention, foot shield sections 1006a and 1006b are included in shield layout 1000 to magnetically shield an area covering a radial distance that includes point 116 (point B in FIG. 1) from center 114.

Figure 11:
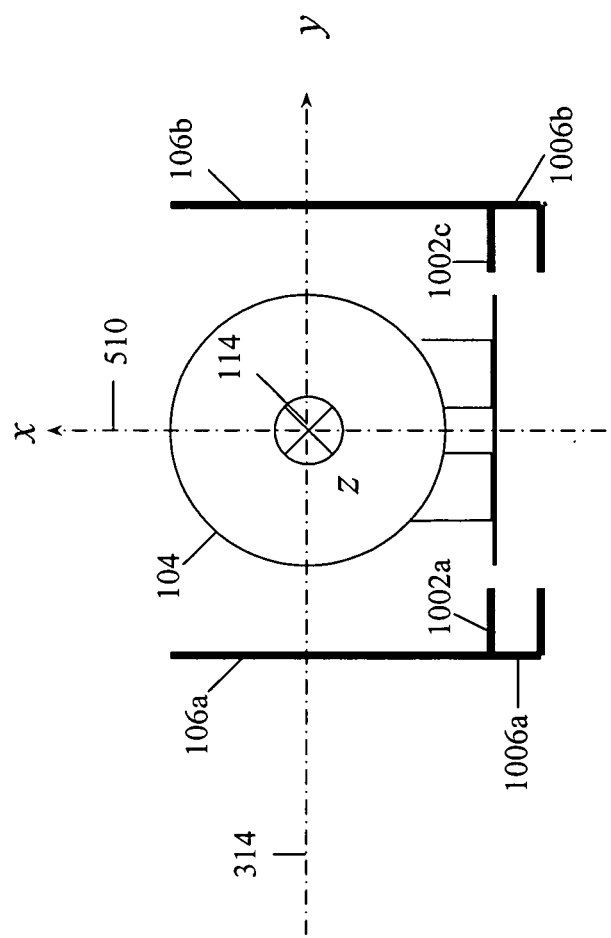
FIG. 11 shows a front view of the passive magnetic field shielding system of FIG. 10, in accordance with yet another exemplary embodiment of the invention.

FIG. 11 shows a front view of shield layout 1000 in accordance with an embodiment of the invention. Axis 510 (x-axis) and axis 314 (y-axis) pass through center 114 of magnet 104. In an embodiment of the invention, the width of each foot shield section 1006a and 1006b and each base section 1002a, 1002b, 1002c, and 1002d, measured along direction 314, is identical.

Figure 12:
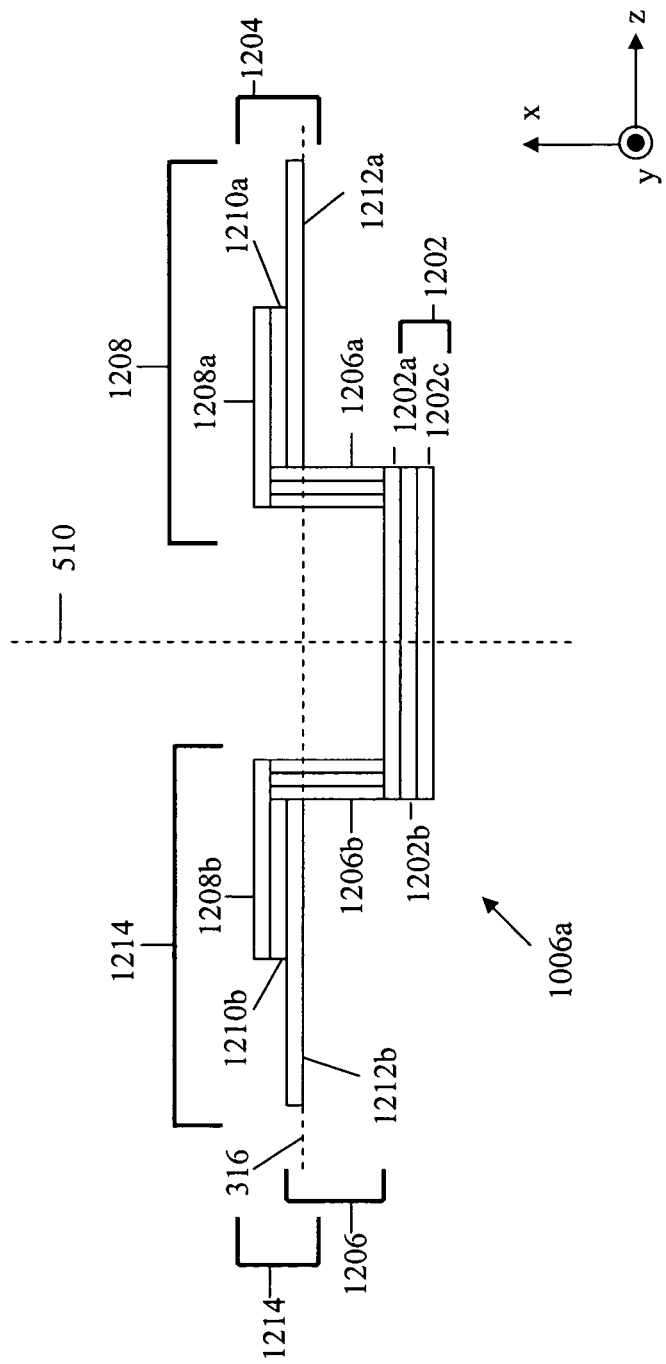
FIG. 12 is a side view of a base section that is placed within the mobile MRI unit, in accordance with yet another exemplary embodiment of the invention.

FIG. 12 shows foot shield 1006a, in accordance with an embodiment of the invention. A first section 1202 is attached at a perpendicular distance from a second section 1204, thereby making first section 1202 at a lower point than second section 1204. First section 1202 is connected to second section 1204 by a set 1206 of parallel vertical plates. Set 1206 of parallel vertical plates includes a set 1206a of parallel vertical plates and a set 1206b of parallel vertical plates.

First section 1202 includes three plates, a plate 1202a, a plate 1202b, and a plate 1202c, with identical dimensions and placed parallel to each other. Second section 1204 includes a first set 1208 of plates including a plate 1208a, a plate 1210a, and a plate 1212a attached at a top end of set 1206a of parallel vertical plates connecting a first end of first section 1202 to first set 1208 of plates. Further, second section 1204 includes a second set 1214 of plates including a plate 1208b, a plate 1210b, and a plate 1212b which are attached at a top end of set 1206b of parallel vertical plates connecting a second end of first section 1202 to second set 1214 of plates. Further, plates in second section 1204 are arranged in a graded structure. In various embodiments of the invention, the dimensions of plates 1208a, 1208b, 1210a and 1210b are identical. Plates 1212a and 1212b have a width that is identical to that of plates 1208a, 1208b, 1210a and 1210b, but have a greater length. It is noted that the length is measured along axis 316 and the width is measured along axis 510.

Figure 13:
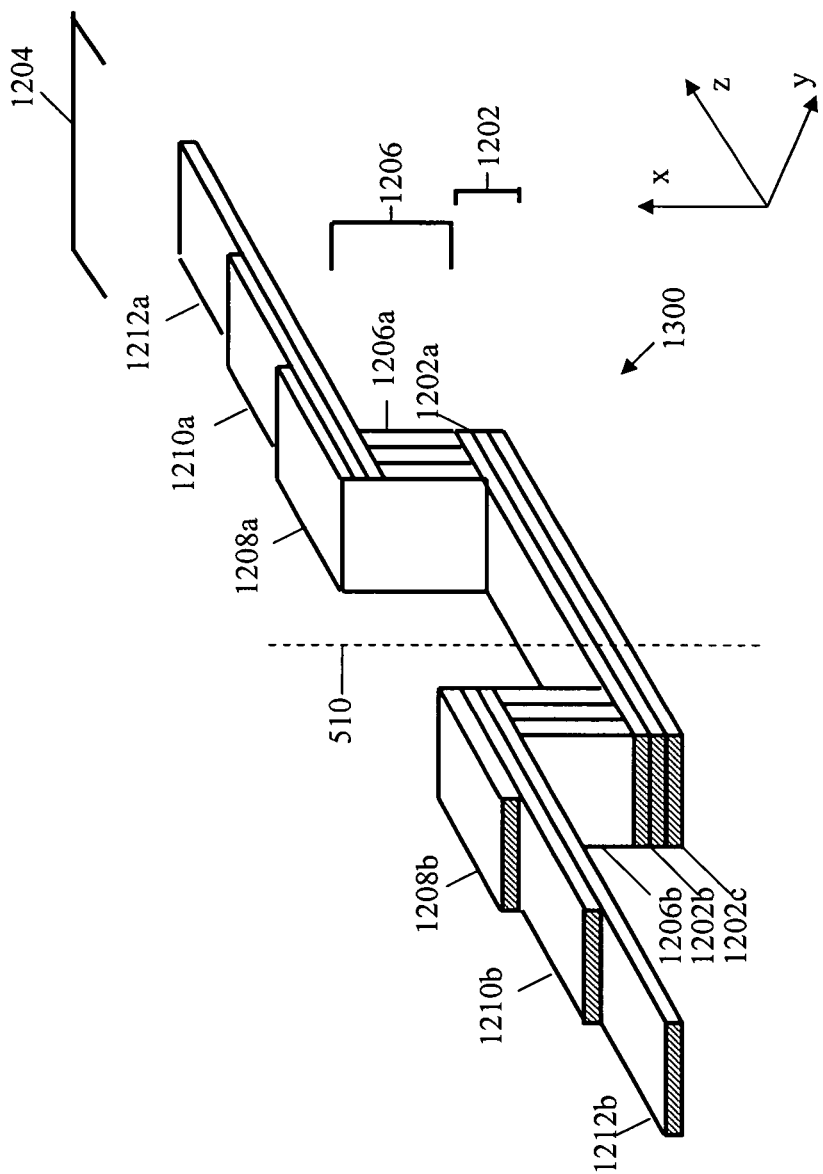
FIG. 13 shows a foot shield, in accordance with an alternate embodiment of the invention.

FIG. 13 shows a foot shield 1300, which is an exemplary embodiment of foot shield 1006a. Foot shield 1300 includes first section 1202 and set 1206 of parallel vertical plates as described with reference to FIG. 12. Plates 1208a and 1208b are identical, but shorter in length (measured along z-axis) than plates 1210a and 1210b respectively. Additionally, the dimensions of plates 1210a and 1210b are also identical. Further, plates 1212a and 1212b are of equal length, but longer than plates 1210a and plates 1210b respectively. In various embodiments, foot shield 1300 is attached, such as, bolted, to each side-wall 106a and 106b of mobile MRI unit 100.

Figure 14:
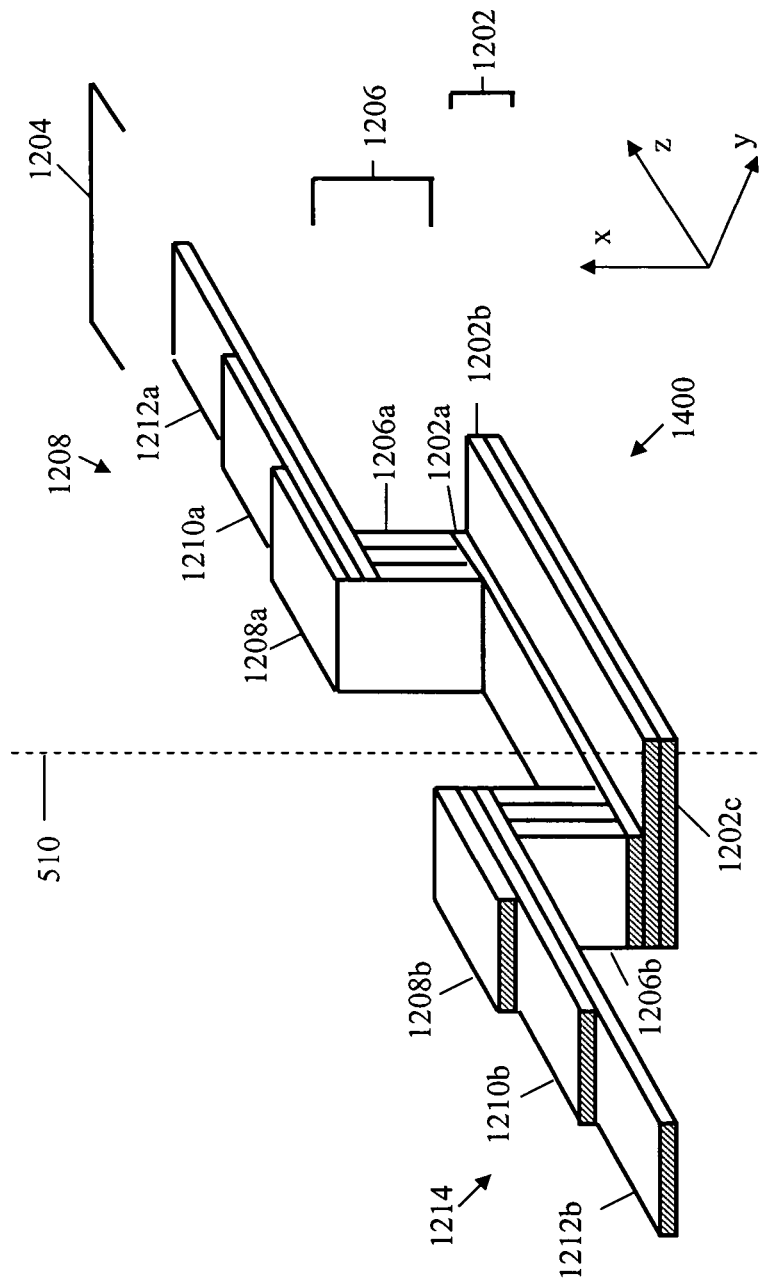
FIG. 14 shows the foot shield, in accordance with yet an alternate embodiment of the invention.

FIG. 14 shows a foot shield 1400, which is an exemplary embodiment of foot shield 1300 shown in FIG. 13. Foot shield 1400 includes second section 1204 and set 1206 of parallel vertical plates as described with reference to FIG. 13. Additionally, first section 1202 is arranged in a graded section. Plates 1202b and 1202c are identical in dimensions and have a larger width (measured along y-axis) compared to plate 1202a.

Foot shield 1400 is attached, such as, bolted, to each side-wall 106a and 106b of mobile MRI unit 100. Further, foot shield 1400 may be attached such that an extension, which is the difference between the width of plates 1202a and plate 1202b, and lies inside mobile MRI unit 100.

In various embodiments of the invention, plates in set 1206, first section 1202 or second section 1204 may be connected by various means of mechanical attachment, such as bolting or fastening. Optionally, plates in set 1206, first section 1202 or second section 1204 may be substituted by a single block with identical dimensions.

In various embodiments of the invention, the material used in the manufacture of passive magnetic shielding system 102 may include oriented steel, perm endure, and/or a low carbon steel such as, for example, 1006 grade carbon steel or 1010 grade carbon steel. However, the exact arrangement of the shield is determined by the actual material used. For example, when permendure is used in side-wall arrangement 200, plate 202a may be removed from side-wall arrangement 200 and still be capable of providing effective magnetic shielding to point 112 and point 116 at imaginary Gauss line 110. Permendure material has high saturation magnetization and favorable permeability. Further, oriented steel has a high permeability and moderate saturation magnetization.

Figure 15:
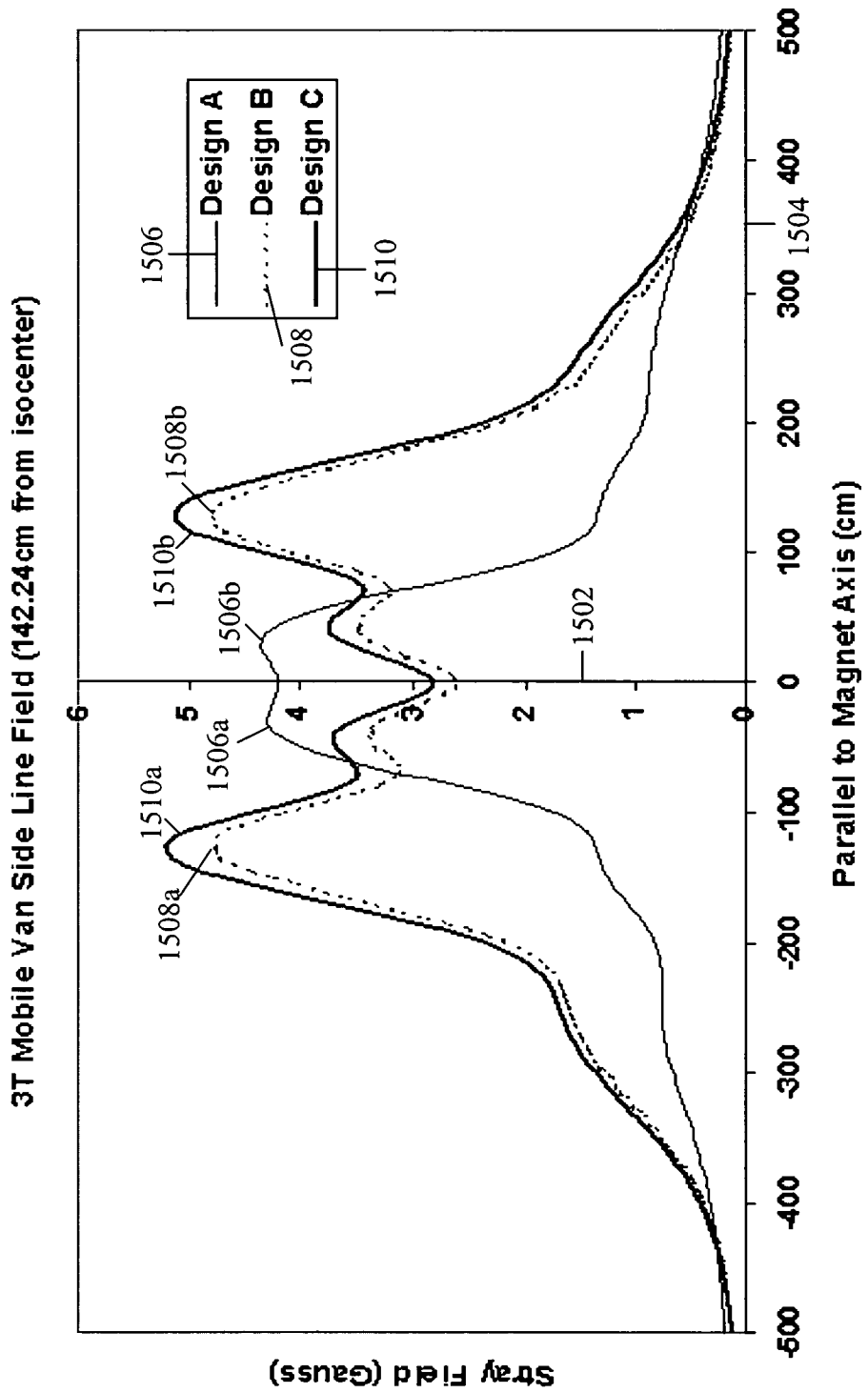
FIG. 15 shows a graph of a magnetic field versus a distance from a center of a magnet within the MRI unit, in accordance with exemplary embodiments of the invention.

FIG. 15 shows a graph of a fringing magnetic field 1502 versus a distance 1504 (along axis 316) from center 114 of magnet 104 corresponding to various embodiments of the invention. A unit on axis 1504 is in centimeters, and a unit on axis 1502 is in Gauss.

Curve 1506 (Design A) corresponds to shield layout 402, curve 1508 (Design B) to shield layout 700, and curve 1510 (Design C) to shield layout 1000. In various embodiments, shield layout 402 has the heaviest weight, shield layout 700 has a weight less heavier than the heaviest weight, and shield layout 1510 has a weight less heavier than the weight of shield layout 700.

For curve 1506, a point 1506a indicates a peak fringing magnetic field of approximately 4.3 gauss, such as between 4.1 gauss and 4.4 gauss, at a distance of approximately 40 cm, such as between 38 cm and 42 cm from centre 114 at a first side of magnet 104. Similarly, a point 1506b indicates a peak fringing magnetic field of approximately 4.3 gauss at a distance of approximately 40 cm, such as between 38 cm and 42 cm from centre 114 at a second side of magnet 104.

For curve 1508, a point 1508a indicates a peak fringing magnetic field of approximately 4.8 gauss, such as between 4.7 gauss and 4.9 gauss at a distance of approximately 150 cm, such as between 148 cm and 152 cm from centre 114 at the first side of magnet 104. Similarly, a point 1508b indicates a peak fringing magnetic field of approximately 4.8 gauss at a distance of approximately 150 cm, such as between 148 cm and 152 cm from centre 114 at the second side of magnet 104.

For curve 1510, the approximate 5-Gauss limit for the fringing magnetic field is achieved at a distance of 142.24 cm from center 114 and is shown by a point 1510a corresponding to a distance on the first side of magnet 104 and a point 1510b corresponding to a distance on the second side of magnet 104.

The fringing magnetic field keeps on decreasing on either side of magnet 104 with an increase in the distance from center 114 in magnet 104. Accordingly, the fringing magnetic field at a distance of 500 cm on either side of magnet 104 is approximately 0.2 Gauss in all three embodiments.

A technical effect of various embodiments of the invention is that they provide an improved system for achieving passive magnetic shielding for a magnet generating a fringing magnetic field with a maximum strength ranging from and including 0.2 T to 3.5 T. Passive magnetic shielding systems also weigh less. The reduction in weight and the increase in magnetic shielding are due to the use of an optimum material and design to construct the passive magnetic shielding system.

In various embodiments of the invention, the selection of the material of passive magnetic shielding system 102 may be varied according to the fringing magnetic field strength desired. Optionally, the number of plates attached in first section 1202, second section 1204 or set 1206 may be reduced or increased. Similarly, the number of plates in side-wall arrangement 200 may be reduced depending on the field strength of the magnet. Although the preceding embodiments are discussed with respect to medical imaging, it is understood that the image acquisition and processing methodology described herein is not limited to medical applications, but may be utilized in non-medical applications as well.

As used herein, an element or step recited in the singular and preceded with the word "a" or "an" should be understood as not excluding plural elements or steps, unless such exclusion is explicitly recited. Furthermore, references to "an" or "one" "embodiment" of the present invention are not intended to be interpreted as excluding the existence of additional embodiments that also incorporate the recited features.

While the invention has been described in terms of various specific embodiments, those skilled in the art will recognize that the invention can be practiced with modification within the spirit and scope of the claims.

What is claimed is:

1. A passive magnetic field shielding system for shielding a fringe magnetic field, said passive magnetic field shielding system comprising:
   a mobile unit;
   a magnet held by said mobile unit, said magnet configured to generate a uniform magnetic field and having a length extending along a z-axis;
   an imaging system with associated electronics coupled to said magnet; and
   a passive shield held by said mobile unit, said passive shield extending alongside the magnet, the passive shield comprising a plurality of plates stacked against each other and extending in a common direction along the z-axis, each plate having a height, a width, and a length, wherein the length of each plate extends along the z-axis of the magnet.

2. A passive magnetic field shielding system in accordance with claim 1, wherein said passive magnetic field shielding system has a combined total weight greater than fifty thousand pounds.

3. A passive magnetic field shielding system in accordance with claim 1, wherein each of the plurality of plates comprises a side defined by the height and length of the plate, the side of each plate generally facing said magnet.

4. A passive magnetic field shielding system in accordance with claim 1, wherein said passive shield comprises at least four plates comprising a first plate, a second plate, a third plate, and a fourth plate, said first, second, third, and fourth plates located parallel to each other and having the same height as each other, said fourth plate shorter in dimension than the first, second, and third plates.

5. A passive magnetic field shielding system in accordance with claim 1, wherein said magnet is configured to generate the fringing magnetic field having a maximum strength ranging from 0.2 Tesla to 3.5 Tesla.

6. A passive magnetic field shielding system in accordance with claim 1, wherein said passive shield comprises a side-wall and a foot shield attached to said side-wall.

7. A passive magnetic field shielding system in accordance with claim 1 further comprising:
   a side-wall;
   a foot shield attached to said side-wall; and
   a base configured to support said magnet, said base located at a perpendicular distance of at most approximately three inches from said foot shield.

8. A passive magnetic field shielding system in accordance with claim 1 further comprising:
   a side-wall;
   a foot shield attached to said side-wall; and
   an extension extending from said side-wall, said extension located outside a controlled environment in which said magnet is placed.

9. A passive magnetic field shielding system in accordance with claim 1 further comprising:
   a side-wall;
   a foot shield attached to said side-wall and in contact with a controlled environment in which said magnet is placed.

10. A passive magnetic field shielding system in accordance with claim 1 further comprising:
    a side-wall; and a foot shield attached to said side-wall, said foot shield comprising a first section and a second section, and said first section located at a lower point than a point at which said second section is located.

11. A passive magnetic field shielding system in accordance with claim 1 further comprising:
a side-wall; and
a foot shield attached to said side-wall, said foot shield comprising a first section and a second section, and said first section located at a lower point than a point at which said second section is located, said first section comprising a plurality of plate members, and at least one of said plate members having a different dimension that the remaining of said plate members.

12. A passive magnetic field shielding system in accordance with claim 1, wherein the length of at least some of the plurality of plates extend parallel to each other.

13. A passive magnetic field shielding system for shielding a fringe magnetic field, said passive magnetic field shielding system comprising:
a mobile unit;
a magnet held by said mobile unit, said magnet configured to generate a uniform magnetic field and having a length extending along a z-axis; and
a passive shield held by said mobile unit, said passive shield extending alongside the magnet, the passive shield comprising a plurality of plates stacked against each other and extending in a common direction along the z-axis, each plate having a height, a width, and a length, wherein the length of each plate extends along the z-axis of the magnet, and wherein the length of said magnet comprises a center, said passive shield comprising a width that includes a greater number of plates adjacent the center of said magnet than at at least one other location along the length of said magnet.

14. A mobile magnetic resonance imaging (MRI) unit comprising:
a mobile vehicle;
a magnet held by said mobile vehicle, said magnet configured to generate a uniform magnetic field and having a length extending along a z-axis; and
a passive shield held by said mobile vehicle, said passive shield configured to reduce the strength of the fringing magnetic field to a threshold level outside a region included within said passive shield and within a pedestrian area, wherein said passive shield comprises a side-wall having a plurality plates stacked against each other and extending in a common direction along the z-axis, each plate having a height, a width, and a length, wherein the length of each plate extends along the z-axis of the magnet.

15. A mobile MRI unit in accordance with claim 14, wherein said side-wall comprises at least four side-wall plates comprising of at least one ferrous plate, said plates located as one of parallel and perpendicular to each other and having the same height as each other.

16. A mobile MRI unit in accordance with claim 14, wherein said magnet is configured to generate a uniform magnetic field having a strength ranging from ranging from 0.2 Tesla to approximately 3.5 Tesla.

17. A mobile MRI unit in accordance with claim 14, wherein said passive shield comprises a foot shield attached to said side-wall.

18. A mobile MRI unit in accordance with claim 14 further comprising:
a foot shield attached to said side-wall; and
a base configured to support said magnet, said base located at a perpendicular distance of at most approximately three inches from said foot shield.

19. A mobile unit for shielding a fringing magnetic field, said mobile unit comprising:
a mobile vehicle;
a magnet held by said mobile vehicle, said magnet configured to generate a uniform magnetic field and having a length extending along a z-axis; and
a passive shield held by said mobile vehicle, said passive shield configured to reduce the strength of the fringing magnetic field to approximately five Gauss at a distance from said passive shield, said passive shield comprising a plurality of plates stacked against each other and extending in a common direction along the z-axis, each plate having a height, a width, and a length, wherein the length of each plate extends along the z-axis of the magnet.

20. A mobile unit in accordance with claim 19, wherein said passive shield comprises at least five plates comprising a first plate, a second plate, a third plate, a fourth plate, and a fifth plate, wherein said first, second, third, and fourth plates have different dimensions from each other, and said fourth and fifth plates have the same dimensions as each other.

21. A mobile unit in accordance with claim 19, herein the plurality of plates define a side-wall of said passive shield, said passive shield configured to reduce the fringing magnetic field of a magnetic field generating device having a strength ranging from 0.2 Tesla to 3.5 Tesla, and said passive shield configured to reduce the strength of the fringing magnetic field to five Gauss measured at a perpendicular distance of approximately six inches from said side-wall.

22. A mobile unit in accordance with claim 19, wherein said magnet and said passive shield are included within a magnetic resonance imaging system.

* * * * *